(12) United States Patent
Zhang

(10) Patent No.: US 10,607,866 B2
(45) Date of Patent: Mar. 31, 2020

(54) HOT WALL FLUX FREE SOLDER BALL TREATMENT ARRANGEMENT

(71) Applicant: Jian Zhang, Brookline, MA (US)

(72) Inventor: Jian Zhang, Brookline, MA (US)

(73) Assignee: Boston Process Technologies, Inc, Danvers, MA (US)

(\*) Notice: Subject to any disclaimer, the term of this patent is extended or adjusted under 35 U.S.C. 154(b) by 20 days.

(21) Appl. No.: 15/998,295

(22) Filed: Aug. 1, 2018

(65) Prior Publication Data

US 2020/0043759 A1    Feb. 6, 2020

(51) Int. Cl.
| | |
|---|---|
| *H01L 21/44* | (2006.01) |
| *H01L 21/67* | (2006.01) |
| *H01L 21/677* | (2006.01) |
| *H01L 21/687* | (2006.01) |
| H01L 23/00 | (2006.01) |

(52) U.S. Cl.
CPC .. *H01L 21/67103* (2013.01); *H01L 21/67757* (2013.01); *H01L 21/68785* (2013.01); *H01L 24/81* (2013.01)

(58) Field of Classification Search
CPC ......... H01L 21/67103; H01L 21/67757; H01L 21/68785; H01L 24/81; H01L 21/67115; C23C 16/4412; C23C 16/45591; C23C 16/4584

See application file for complete search history.

(56) References Cited

U.S. PATENT DOCUMENTS

| | | | |
|---|---|---|---|
| 6,949,143 B1* | 9/2005 | Kurita | B65G 49/068 118/719 |
| 2014/0127838 A1* | 5/2014 | Huang | H01L 22/20 438/17 |
| 2017/0159181 A1* | 6/2017 | Toyoda | C23C 16/4412 |

\* cited by examiner

*Primary Examiner* — Victor A Mandala
*Assistant Examiner* — Colleen E Snow
(74) *Attorney, Agent, or Firm* — Don Halgren

(57) ABSTRACT

A vertically oriented treatment chamber for the processing of a flux-free solder ball (or plated solder ball) loaded wafer chip. A treatment chamber comprises a first or upper heater at an upper end of the treatment chamber and a second or lower heater at a lower end of the treatment chamber. The treatment chamber includes a centrally disposed, preloaded flux free solder ball loaded wafer chip support ring movable upwardly and downwardly within the treatment chamber in response to temperature sensed monitoring of a wafer chip supported on the wafer chip support ring.

15 Claims, 6 Drawing Sheets

HOT WALL FLUX FREE SOLDER BALL TREATMENT ARRANGEMENT

FIELD OF THE INVENTION

This invention relates to arrangements for the manufacture of wafer chips or substrates with solder balls (or plated solder balls, which all may also be called "bumps") attached thereto, and more particularly to devices for processing wafers with a fluxless or flux-free binder in a heated, vertical displaceable manner within a controlled, variably heated treatment chamber. For discussion here, plated solder balls, solder balls, bumps and the like will all be designated "solder balls" to avoid confusion. The wafer chips with solder balls pre-attached for their processing in this hot wall flux free solder ball treatment arrangement are described in a sister application. (which current non provisional application is based upon provisional application 62/605,288, filed on 7 Aug. 2017), prior to that solder ball arrangement being heat processed in a flux free solder reflow or solder ball join arrangement which is described in a sister provisional application (62/605,277, filed 7 Aug. 2017), now U.S. patent application Ser. No. xxx,yyy, filed 1 Aug. 2018 each of which provisional application and sister application is incorporated herein by reference in its entirety.

BACKGROUND OF THE INVENTION

Solder ball mount machines typically have a process flow wherein a wafer is picked up by a robot arm and placed onto a flux station. For "plated" solder, flux will be coated on the entire chip wafer. And for "solder balls", a mask would be aligned for bump pads on the wafer through alignment marks at that station. Flux would be applied through the template or mask. Flux is opaque and hence ball mount alignment would be covered by a flux alignment template to prevent flux from coating the ball mount alignment mark. The mask would be aligned to the wafer by ball mount alignment marks using an optical vision arrangement at the solder ball mount station. The wafer, after inspection would be placed into the processing chamber. Contamination is common. The flux, being opaque thus requires several sets of template unmasks. Multiple sets of alignment mechanisms are needed. Multiple treatment chambers are also required for the various temperatures required for a wafer chip.

It is an object of the present invention to overcome the disadvantages of the prior art.

It is a further object of the present invention to shorten the process steps, time and expense of the prior art systems by processing wafer chips in a single processing station which accommodates the variation in temperature required therefor.

It is yet a further object of the present invention to provide a wafer chip processing arrangement which utilizes a number of different heating sources.

It is still yet a further object of the present invention to enable a plurality of wafer chip processing modules to be serviced by a common robotic arrangement.

It is yet another object of the present invention to enable a wafer chip being processed to control its temperature by adjusting its vertical position within a treatment chamber.

BRIEF SUMMARY OF THE INVENTION

The present invention comprises an elongated vertically oriented hot wall flux-less or flux free solder reflow chamber for the processing of wafers for the electronic chip industry. The flux free solder reflow chamber has a top or upper end and a bottom or lower end with a conductive hot wall enclosure extending therebetween. The flux free solder reflow chamber is computer controlled with an arrangement of feedback loops throughout the system. The upper end has a computer controlled disk heater member extending thereacross. The lower end of the reflow chamber has a wafer chip adapter ring receiving member supported vertically movable upwardly and downwardly by an adapter ring lift arrangement extending through the bottom or lower end of the reflow chamber. The adapter ring lift arrangement is movable by connection to a motor driver, responsive to computer feedback from temperature sensors and timers described further hereinbelow. A bottom heater is arranged within the adapter ring lift arrangement and is vertically adjustable on an inner shaft by a computer controlled pneumatic driver. The bottom heater and the pneumatic driver are in communication with the feedback loops of the computer control arrangement.

The wafer chip is provided to the adapter ring by a robotic arm after the chip has been preloaded and attached thereto with its solder balls, flux-free, applied onto an arrangement of bump pads on the wafer in a previous treatment module. The top and bottom heaters are activated according to the proper temperatures instructed by the computer control system. The adapter ring is advanced vertically upwardly and downwardly within the reflow chamber on elevator pins according to its instructions received by the control computer relative to the desired temperature required for proper solder ball treatment. The elevator pins have a plurality of temperature sensors in contact with the wafer, supportively their around, while the adapter ring is being advanced vertically.

The temperature within the reflow chamber increases towards the upper end of the reflow chamber and the temperature decreases towards the lower end of the reflow chamber. The variation in temperature at varying vertical positions within the reflow chamber of the present invention thus permits the accurate and complete control of the wafer treatment process to be accomplished within a single treatment chamber. The use of a vertically adjustable wafer support within a reflow chamber of the present invention permits complete processing in a single chamber without the necessity of going from an individual single temperature chamber to a successive single temperature chamber as is typical of the prior art.

Further embodiments within the scope of the present invention include the elongated vertically disposed reflow chamber having one or more annually arranged supplemental heater rings disposed in a spaced-apart manner so as to further concentrate and adjust the higher temperature at the upper end thereof. Additional sensors to those in the embedded in the elevator pins may be disposed within the walls of the enclosure of the reflow chamber to optically or radiationally determine and report via the computer control loop, the temperature across a wafer chip being processed.

A yet further embodiment of the walls of the enclosure of the reflow chamber includes one or more annular thermal insulator rings to control the temperature gradient more fully between the upper end of the reflow chamber and the lower end of the reflow chamber, both within the wall itself and within the vertical atmosphere of the reflow chamber. Further temperature control within the reflow chamber at the lower end thereof may include an annular array of chill ports therearound, to direct, as needed and instructed by the control computer, to effect coolant fluid such as air, to reach a further temperature differential at that lower end of the reflow chamber.

A full wafer reflow production unit is wherein an ambient control loadlock station is arranged to receive unprocessed wafer chips from a robotic delivery arm. The components of the wafer production unit revolve on a carousel so as to fully process each wafer chip in a single station from loading, to heat treatment and to subsequent cooling and unloading of the processed chip and reloading of a new unprocessed chip. The wafer production units may thus all be served by a common wafer chip loading and unloading robot serving an array of wafer production units to facilitate mass production of fully-processed-single-station wafer chips.

The invention thus includes a treatment chamber for the processing of a solder ball preloaded wafer chip, comprising: an elongated housing having an upper end and a lower end; a primary heating member arranged across the upper end of the elongated housing; a secondary heating member disposed within the lower end of the elongated housing; and a vertically movable wafer chip adapter ring support arranged to move as needed, a wafer chip supported thereon between a relatively lower temperature lower end of the elongated housing and a relatively higher temperature upper end of the elongated housing.

The invention also includes a method of processing a preloaded solder ball wafer chip within a single vertically oriented, elongated flux free solder reflow chamber comprising the steps of: arranging a flux free solder ball loaded wafer chip onto a wafer chip adapter support ring; heating an upper end of the flux free solder reflow chamber; and moving the wafer chip adapter support ring towards and away from the upper end of the flux free solder reflow chamber in response to a sensor controlled computer feedback loop signal.

The invention also further comprises a vertically oriented treatment chamber for the processing of a flux free solder ball loaded wafer chip, comprising: a first or upper heater at an upper end of the treatment chamber; a second or lower heater at a lower end of the treatment chamber; and a preloaded flux free solder ball loaded wafer chip support ring, movable upwardly and downwardly within the treatment chamber in response to temperature sensed monitoring of a wafer chip supported on the wafer chip support ring.

The invention also comprises a wafer chip treatment chamber for the processing of a solder ball preloaded wafer chip therein, comprising: an elongated heated housing having an upper end and a lower end; a conductive hot wall extending around the upper end of the elongated heating housing; a primary stationary heating member arranged across the upper end of the conductive hot wall extending around the upper end of the elongated housing; a vertically displaceable secondary bottom heating member disposed within a lower housing within the lower end of the elongated housing; and a vertically movable wafer chip adapter ring support arranged to move and hold a wafer chip supported thereon between a relatively lower temperature lower end of the elongated housing and a relatively higher temperature upper end of the elongated housing during the wafer chip heat treatment process. The displaceable bottom heating member may have a suction arrangement thereon to snugly secure a solder ball laden wafer chip thereagainst during a portion of the wafer chip heat treatment process. A plurality of elevator pins are arranged through the lower end of the elongated housing, the elevator pins being vertically displaceable to lift the wafer chip adapter ring and a wafer thereon into the upper end of the elongated housing. The elevator pins preferably have a plurality of temperature sensors embedded therein in communication with a control computer. The primary stationary heating member across the upper end of the elongated housing includes a top heater disc-like ceiling member and a separate ring heater to controllably heat the upper end of the elongated housing. A plurality of gas inlet ports extend through the conductive hot wall extending around the upper end of the elongated housing to enable temperature controlled gas to be supplied within the upper end of the elongated housing. A gas exhaust port extends through the top heater ceiling member to enable the temperature controlled gas to be exhausted from the upper end of the elongated housing.

The invention also includes a method of processing a preloaded solder ball wafer chip within a single vertically oriented, elongated flux free solder reflow chamber comprising the steps of: arranging a flux free solder ball loaded wafer chip onto a wafer chip adapter support ring; heating an upper end of the flux free solder reflow chamber; and moving the wafer chip adapter support ring toward and away from an upper end of the flux free solder reflow chamber as needed, in response to a sensor controlled computer feedback loop signal in the elevator support pins; sensing the temperature of the wafer chip supported on the by an array of sensors carried by the elevator support pins in communication with a control computer; securing the wafer chip supported on the wafer chip adapter support ring against a bottom heater, by a vacuum source arranged through the bottom heater and suctioning the wafer chip thereagainst, to insure close firm conductive heating between the wafer chip and the bottom heater; lifting the wafer chip adapter support ring and the wafer thereon vertically upwardly by a peripheral array of vertically displaceable elevator pins arranged outwardly of the bottom heater; arranging a plurality of grooves across the bottom heater so as to enable full vacuum controlled suction of the heated wafer thereagainst; separating the plurality of grooves across the bottom heater into different individually controlled negatively pressurizable collections to enable different vacuum strengths to be applied thereacross for the conduction heat treatment of the wafer; advancing the wafer chip adapter support ring to a successive treatment cooling chamber for conductive cooling of the wafer chip on a convective cooling gas flow plate; and applying a showerhead of nitrogen gas onto the wafer chip in an upper end in the treatment cooling chamber.

The invention also includes a vertically oriented $1^{st}$ heat treatment chamber and a vertically oriented $2^{nd}$ chip cooling treatment warpage management chamber for the processing of a flux free solder ball loaded wafer chip, comprising: a first or upper heater at an upper end of the $1^{st}$ treatment chamber; a second or lower heater at a lower end of the $1^{st}$ treatment chamber; and a preloaded flux free solder ball loaded wafer chip support ring movable upwardly and downwardly within the $1^{st}$ treatment chamber in response to temperature sensed monitoring of a wafer chip supported on the wafer chip support ring; an indexable rotatable carrier disc for rotating a heat treated wafer chip on the wafer chip support ring from the $1^{st}$ treatment chamber to the $2^{nd}$ treatment chamber; a chip receivable gas flow cooling plate arranged intermediately within the $2^{nd}$ treatment chamber arranged to receive a heated treated wafer chip, wherein the gas flow cooling plate is vertically advanceable towards a nitrogen gas dispensing showerhead for convectively cooling the heat treated wafer chip. The entire heating process of a flux free solder ball loaded wafer chip occurs during vertical motion of that wafer chip within the $1^{st}$ treatment chamber.

The invention also includes a method of heat processing a preloaded solder ball wafer chip within a single vertically oriented, elongated flux free solder reflow chamber comprising the steps of: arranging a flux free solder ball loaded wafer chip onto a wafer chip adapter support ring; heating an upper end of the flux free solder reflow chamber to a proper first specific upper temperature; heating a lower end of the flux free solder reflow chamber to a proper second specific lower temperature; and holding and moving the wafer chip adapter support ring between vertical positions in a material-required temperature gradient within the flux free solder reflow chamber, as needed, in response to an elevator pin mounted sensor in communication with a controlled computer feedback loop signal.

BRIEF DESCRIPTION OF THE DRAWINGS

The objects and advantages of the present invention will become more apparent when viewed in conjunction with the following drawings in which.

DETAILED DESCRIPTION OF THE DRAWINGS

Figure 1:
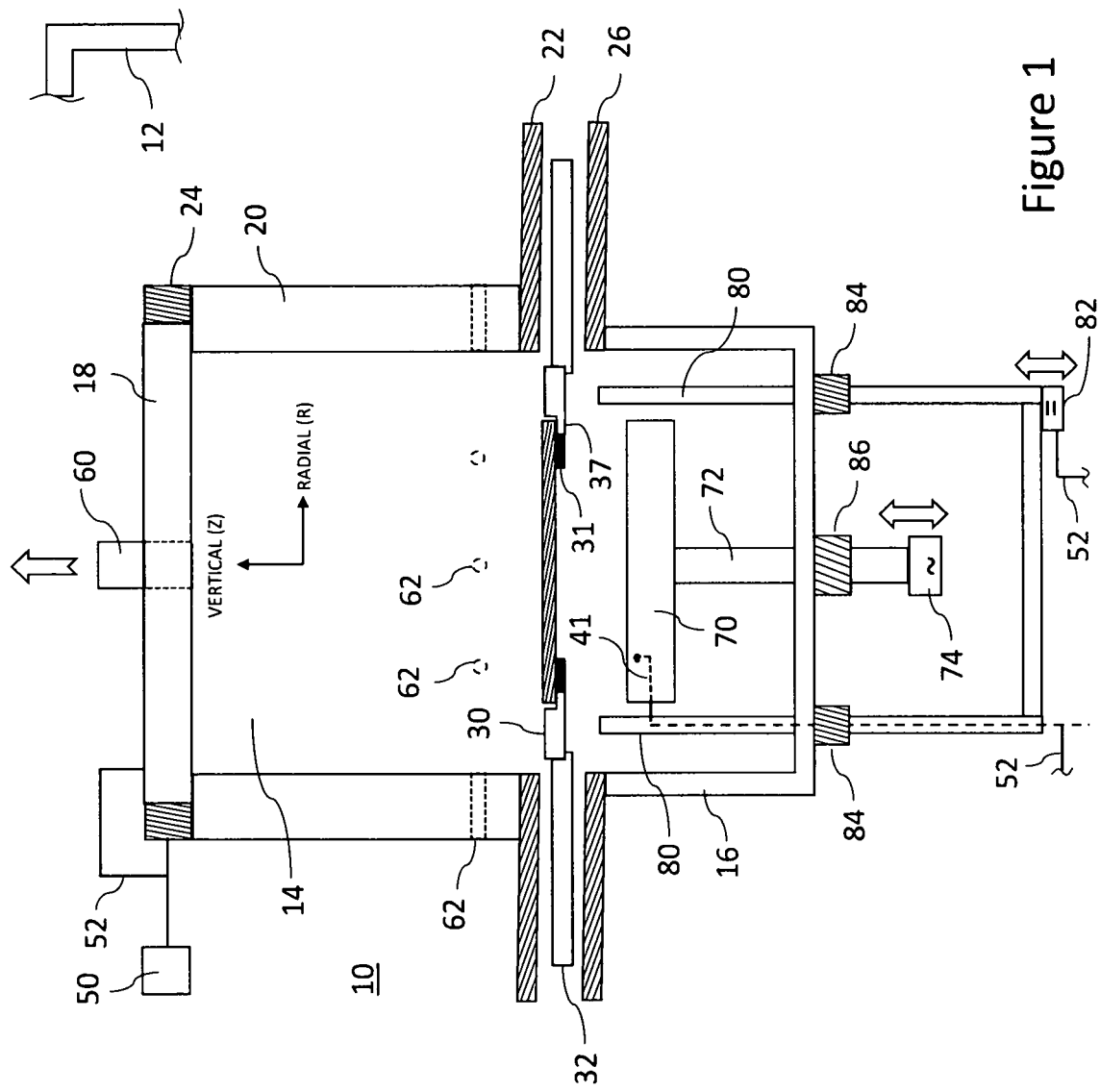
FIG. 1 is a side elevational view of a flux-less solder reflow wafer-processing heat treating station constructed according to the principles of the present invention, showing a wafer therein, as it is initially loaded into the station.

Referring now to the drawings in detail, and particularly to FIG. 1, there is shown a side elevational view of the present invention of a reflow/heating station 10 within the reflow module 12. The reflow station 10 comprises an upper chamber 14 and a cup-shaped lower chamber 16. The upper chamber 14 includes a top heater ceiling 18, a conductive hot wall 20 peripherally supporting the top heater ceiling 18 on a base plate 22 within the reflow station 10. A ring heater 24 is peripherally disposed immediately adjacent and heat-conductively the perimeter of the top heater ceiling 18, and also heat-conductively sits upon the upper edge of the conductive hot wall 20, as represented in FIG. 1. The top heater ceiling 18 and the ring heater 24 are temperature controlled by a control computer 50, through a proper control circuit 52. The top heater ceiling 18 has a gas exhaust port 60 extending therethrough. The conductive hot wall 20 has a plurality of gas inlet ports 62 extending therethrough for the supply of treatment gas from a source, not shown in the drawings.

Figure 2:
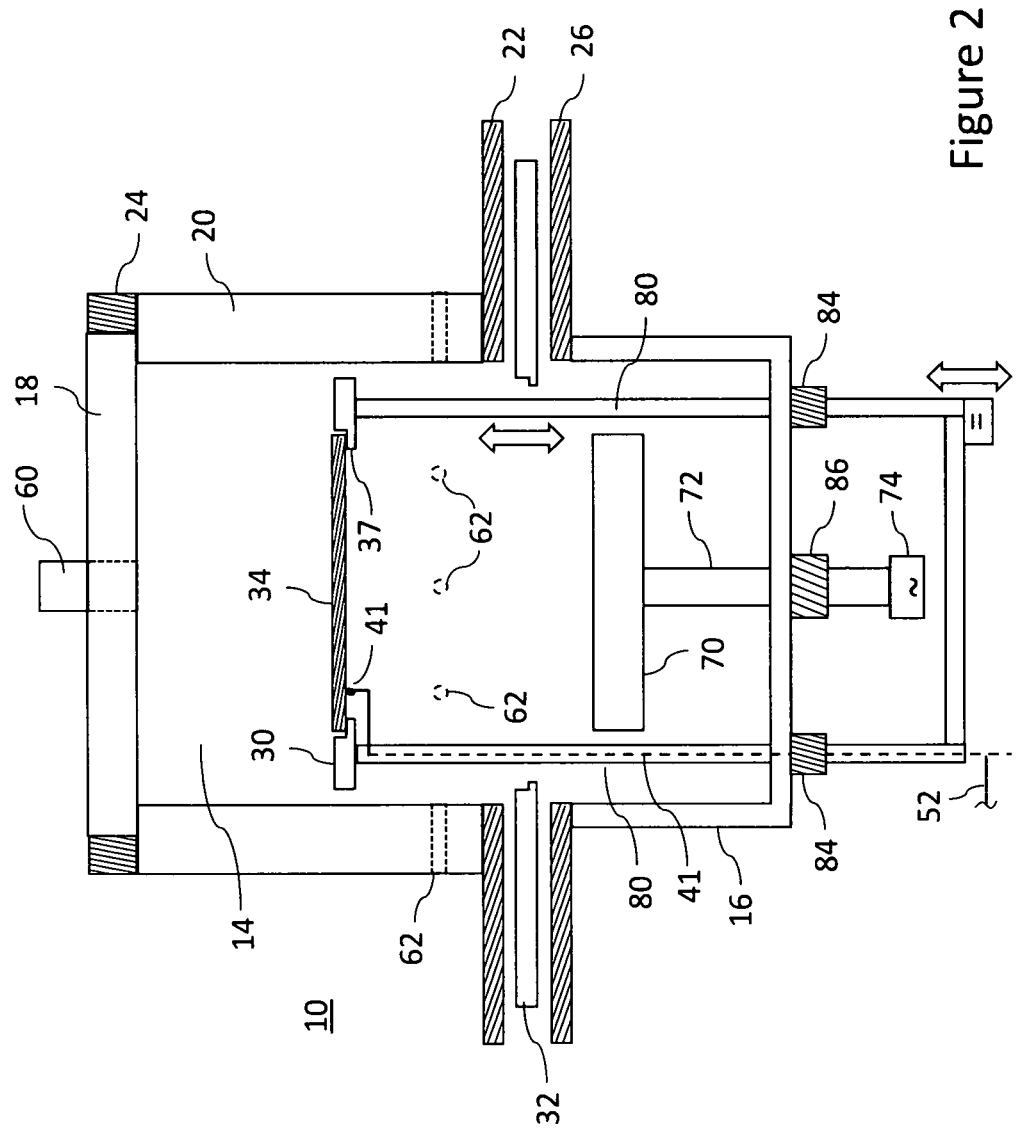
FIG. 2 is a view similar to that shown in FIG. 1, showing a wafer being advanced into an upper heat treatment portion of the wafer processing station for convective heating therewithin.
Figure 3:
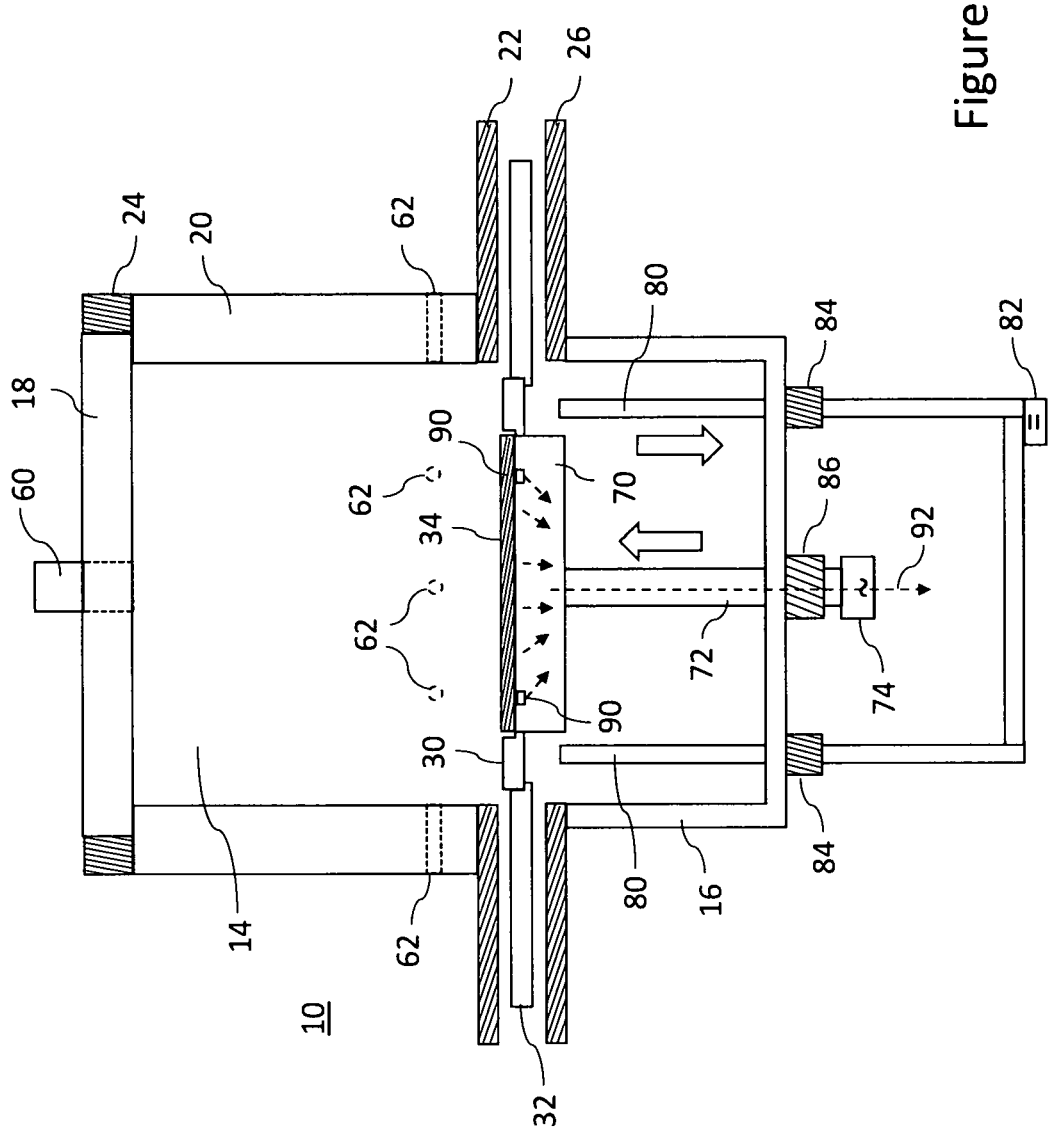
FIG. 3 is a further view similar to that shown in FIG. 1, showing a wafer having been lowered to a support position within the wafer processing station, wherein the conductive heating of that wafer is enabled by the lowering of the wafer as shown, into contact with a bottom heater plate.

The lower chamber 16 is in coaxial alignment with the upper chamber 14 and is connectively attached to a lower base plate 26, as may be seen in FIGS. 1, 2 and 3. A wafer supporting adapter ring 30 is itself supported on a rotatable carrier disc 32 as is shown in edge view in FIG. 1. The rotatable carrier disc 32 intermittently and successively and rotatively transfers a solder-ball-laden wafer 34 into and out of the reflow station 10 between the upper chamber 14 and the lower chamber 16 in the heat treatment thereof, between the base plate 22 and the lower base plate 26, as shown in FIG. 1, upon instruction from the control computer 50. The wafer 34 sits on an edge support 37 on the inner periphery of the adapter ring 30. In one embodiment, the edge support comprises a lip around the inner periphery of the adapter ring 30. In another embodiment, the edge support 37 comprises a plurality of support pins 31. The edge support 37 is preferably recessed below the surface of the bottom heater 72 to further assist in full contact of the wafer 34 there with, as described further hereinbelow.

Lower chamber 16 includes a bottom heater 70 supported upon a computer controlled, vertically movable, pneumatically driven inner shaft 72, by a computer controlled inner shaft driver 74, which extends through the lower portion of the lower chamber 16. The bottom heater 70 is sized so as to closely engage the lower side of the wafer 34 being held by the adapter ring 30. An array of elevator pins 80 peripherally surround the perimeter of the bottom heater 70. The elevator pins 80 are in vertical alignment with the underside of the annular adapter ring 30. The elevator pins 80 are actuated in the Z direction by a servo motor 82 which functions under closed loop control with the control circuit 52. A plurality of temperature sensors 41 are arranged within or on the elevator pins 80. The sensors 41 continuously monitor the temperature of the contacted wafer 34 and relay this data to the control computer 50 through the proper circuit 52. An arrangement of sealable bellows 84 and 86 enclose the elevator pins 80 and the inner shaft 72 beneath the bottom of the lower housing 16, respectively, as may be seen in FIG. 1. The bellows 84 and 86 are purged with nitrogen and allow the elevator pins 80 and the inner shaft 72 to penetrate the enclosed reflow station 10.

The computer controlled heating arrangement of the top heater ceiling 18 and the ring heater 24 are utilized to convectively heat the wafer 34 during its processing within the reflow station 10. The top ceiling heater 18 and the ring heater 24 are typically set to higher temperatures by the control computer 50 than the temperature set to the bottom heater 70. The ring heater 24 minimizes thermal edge losses from the top heater ceiling 18 and it also contributes to the heating of the conductive hot wall 20 maintaining the temperature gradient therein. The conductive hot wall 20 maximizes the radial temperature uniformity of the environment within the enclosed reflow station 10. The conductive hot wall 20 also establishes a temperature gradient in the upper half of the reflow station 10, with the highest temperature located at the top of the chamber closest to the top heater ceiling 18, as also assisted by the ring heater 24. The atmosphere within the reflow station 10 is maintained by the pressure and temperature controlled mixture of gases introduced to the interior of the reflow station through the array of gas inlet ports 62 disposed across the lower portion of the conductive hot wall 20 as indicated in FIG. 1. The exhausting and recycling of these pressure and temperature controlled mix of gases occurs through the exhaust port 60 extending through the top heater ceiling 18.

The wafer 34 is shown in a raised orientation by the elevator pins 80 asserted vertically against the lower side of the adapter ring 30, vertically away from and spaced apart from the bottom heater 70. The wafer 34 is thus being convectively heated in the upper portion of the reflow station 10. The temperature gradient through the Z or vertical direction, is controlled primarily by the heat convectively emanating from the top heater ceiling 18. The higher the Z, the higher the temperature within the upper chamber 14. The sensors 41 continuously monitor the temperature of the wafer 34 and feed this data to the control computer 50 via the circuit 52. The temperature in the wafer 34 is also controlled by adjusting its vertical position in the Z direction by controlling the extended height of the elevator pins 80. In one preferred embodiment, the elevator pins 80 are actuated and height controlled using a closed loop control with the temperature of the wafer 34 as the primary input. In a further preferred embodiment, the vertical position of the wafer 34 is adjusted utilizing a closed loop control wherein the vertical position of the elevator pins 80 themselves are the single primary input.

The further heating approach of the wafer 34 is indicated in FIG. 3, wherein the wafer 34 is conductively heated against its bottom side by the lowering of the elevator pins 80 into disengagement with the adapter ring 30 supporting the wafer 34 and the bottom heater 70 having been raised by its pneumatic driver 74 into such bottom contact with the bottom side of the wafer 34. The bottom heater 70 includes an array of grooves 90 connected to a vacuum source 92 which extends through the inner shaft 72 supporting the bottom heater 70. A vacuum force thus holds the wafer 34 flat further improving the thermal contact between the wafer 34 and the upper surface of the bottom heater 70. The vacuum grooves 90 are preferably divided into multiple independently controlled vacuum zones in the bottom heater 70.

Figure 4:
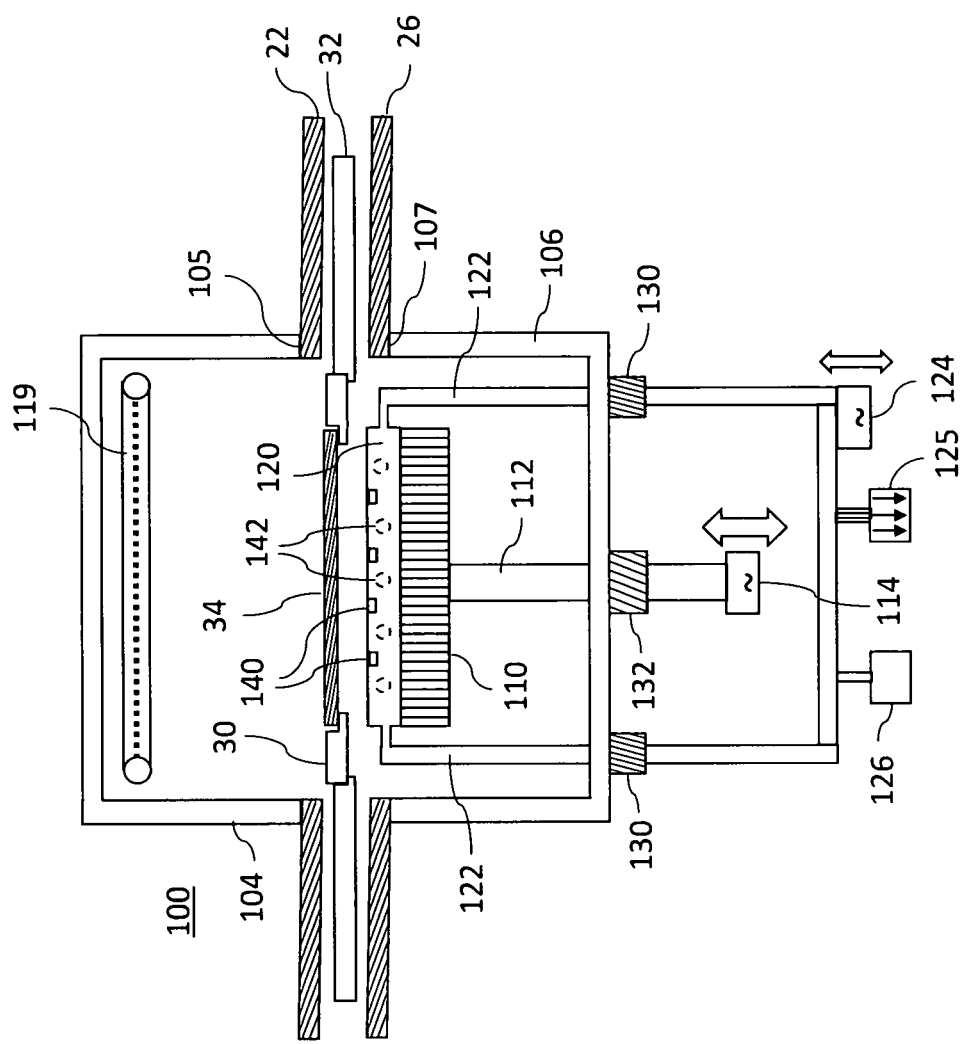
FIG. 4 is a side elevational view of a warpage management station wherein a heat-treated wafer has been transposed by a rotatable carrier desk into an initial position above a controlled vertically movable heater plate, for the heat treated wafer's initiation of solidification cooling, controlled cooling and free-convective cooling within the warpage management station.
Figure 5:
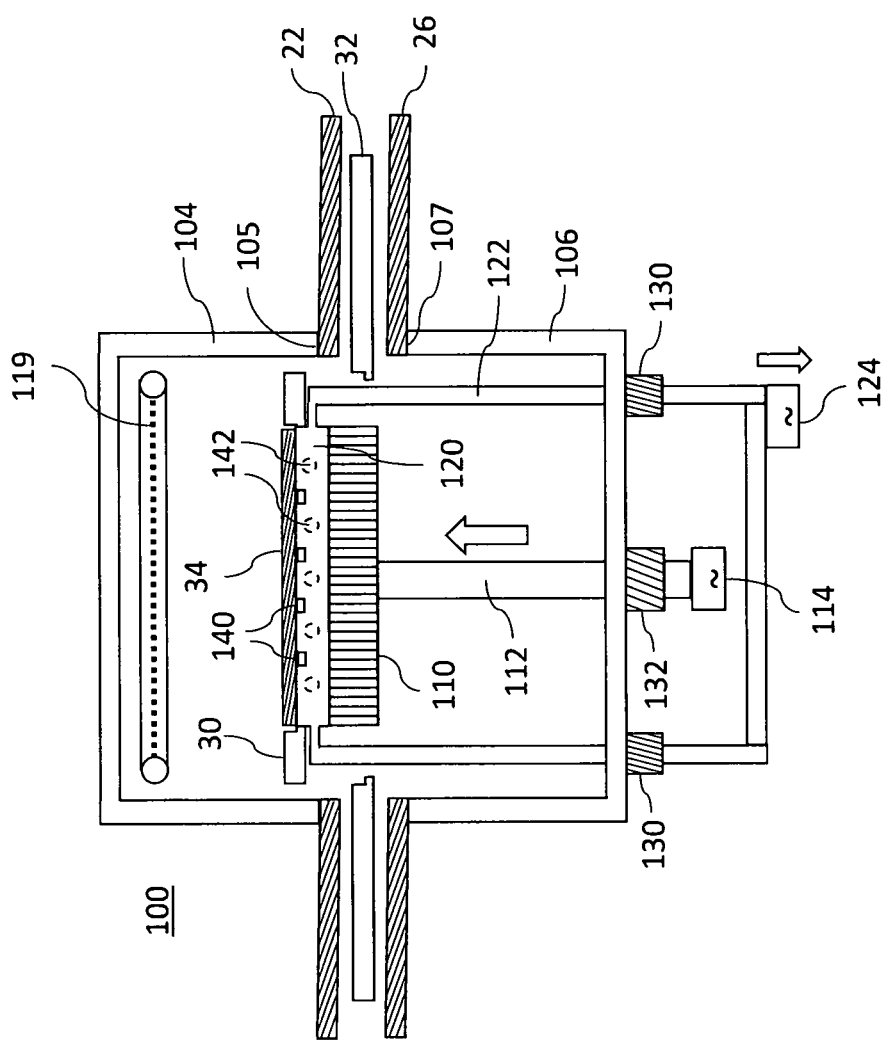
FIG. 5 is a side elevational view similar to that shown in FIG. 4 depicting a heat treated wafer undergoing initial solidification cooling in the raised orientation within the warpage management station.
Figure 6:
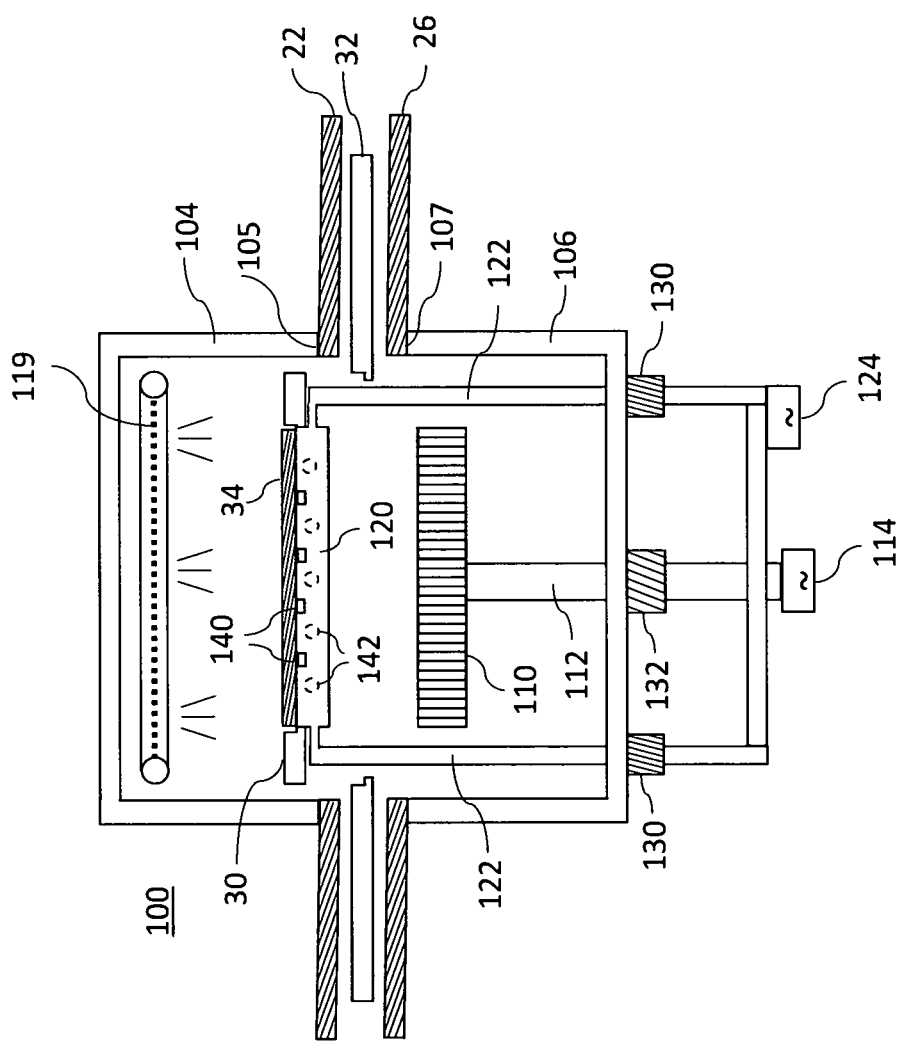
FIG. 6 is a side elevational view similar to that shown in FIG. 5, depicting the heat treated wafer undergoing controlled cooling by means of contact with a vertically articulable heating plate and cooling gas released directly into the chamber of the warpage management station.

Upon proper heating of the wafer 34 within the reflow station 10, the carrier disc 32, as a next step in the treatment of a solder ball laden wafer chip 34, such carrier disc 32 is rotatively indexed to introduce a heated wafer 34 on its adapter ring 30 into a warpage management station 100, as represented in FIGS. 4, 5 and 6. The warpage management station 100 has an upper chamber housing 104 which is secured at its lower periphery 105 to the base plate 22. The upper chamber housing 104 includes a gas supplied peripherally arranged gas showerhead 119. The warpage management station 100 has a lower chamber housing 106 which has an upper periphery 107 attached to the lower base plate 26. A computer controlled heater plate 110 is supported in vertical movement by an inner shaft 112 having a lower end in connection with a vertically controlled by a $1^{st}$ heater pneumatic driver 114. A gas flow plate 120 is disposed upon the heater plate 110 and is vertically displaceable therefrom by an arrangement of linkage arms 122 which extend through the bottom of the lower chamber housing 106 and controllably driven by a computer controlled $2^{nd}$ plate pneumatic driver 124. The gas flow plate 120 and the heater plate 110 are arranged to operate semi-independently from one another. The inner shaft 112 and the linkage arms 122 each have a bellows arrangement 132 and 130 respectively, sealing and controlling the atmosphere within the upper and lower housing chambers 104 and 106.

The cooling of a solder ball laden heat treated wafer 34 is initiated subsequent to the arrival of the wafer 34 on its adapter ring 30 (as depicted in FIG. 4) such initiation of cooling being represented in FIG. 5, wherein the heater plate 110 and the gas flow plate 120 raise together toward the underside of the heated chip 34 by actuating the gas flow plate pneumatic driver 124 downwardly against the now vertically rising heater plate 110 without impeding their collective upward motion. Once the gas flow plate 120 contacts the underside of the wafer 34, an array of vacuum channels 140 in the surface of the gas flow plate 120 automatically, through sensors, not shown, applies a suction against the wafer 34 to solidly grip the wafer 34. The vacuum channels 140 within the surface of the gas flow plate 120 are divided into multiple independently controlled vacuum zones and are connected to a vacuum source 125 via the linkage arms 122. Chill channels 142 also extend through the gas flow plate 120 and are connected to a chilling gas source 126 via the linkage arms 122. The wafer 34 is thus conductively cooled to the temperature of the heater plate 110 which is below the solidification temperature of the solder balls on the solder ball laden wafer 34.

Controlled cooling of the wafer 34 is represented in FIG. 6. The plate pneumatic driver 124 is actuated upwardly and the heater plate 110 is lowered into its down position by computer-driven actuation of the heater pneumatic driver 114. The gas flow plate 120 remains in contact with the underside of the cooling wafer 34 as nitrogen gas is caused to flow through the chill conduits 142 within the gas flow plate 120, gradually cooling the wafer 34. Nitrogen gas may also be admitted to the upper chamber 104 via the nitrogen gas showerhead 119. Cooling the wafer 34 while it remains in contact with the gas flow plate 20 insures temperature uniformity of the wafer 34, and minimizes thermal stress and wafer warpage.

Upon sensor determination of the desired temperature of the wafer 34, the gas flow plate 120 is instructed to release its suction and is caused to lower itself within the lower housing 106, and the wafer 34 is again held only by the perimeter of the adapter ring 30. Nitrogen gas may continue to be admitted into the upper chamber 104 via the nitrogen gas showerhead 119, thus cooling the wafer 34 convectively. The wafer 34 cools more quickly once it is no longer in thermal contact with the gas flow plate 120. Once convective cooling if finished, a carrier disc 32 is then rotatively indexed to remove the now chilled wafer 34 and bring in a fresh heated wafer 34 within the warpage management station 100.

The invention claimed is:

1. A wafer chip treatment chamber for the processing of a solder ball preloaded wafer chip therein, comprising:
   an elongated heated housing having an upper end and a lower end;
   a conductive hot wall extending around the upper end of the elongated heating housing;
   a primary stationary heating member arranged across the upper end of the conductive hot wall extending around the upper end of the elongated housing;
   a vertically displaceable secondary bottom heating member disposed within a lower housing within the lower end of the elongated housing; and
   a vertically movable wafer chip adapter ring support arranged to move and hold a wafer chip supported thereon between a relatively lower temperature lower end of the elongated housing and a relatively higher temperature upper end of the elongated housing during the wafer chip heat treatment process, wherein the wafer chip adapter ring has a plurality of vertically wafer chip movable elevator pins arranged therearound in communication with a control computer, wherein a plurality of elevator pins are arranged through the lower end of the elongated housing, the elevator pins being vertically displaceable to lift the wafer chip adapter ring and a wafer thereon into the upper end of the elongated housing, and wherein the primary stationary heating member across the upper end of the elongated housing includes a top heater ceiling member and a separate ring heater to controllably heat the upper end of the elongated housing.

2. The wafer chip treatment chamber as recited in claim 1, wherein the displaceable bottom heating member has a suction arrangement thereon to snugly secure a solder ball laden wafer chip thereagainst during a portion of the wafer chip heat treatment process.

3. The wafer chip treatment chamber as recited in claim 1, including a plurality of gas inlet ports extending through the conductive hot wall extending around the upper end of the elongated housing to enable temperature controlled gas to be supplied within the upper end of the elongated housing.

4. The wafer chip treatment chamber as recited in claim 3, including a gas exhaust port extending through the top heater ceiling member to enable the temperature controlled gas to be exhausted from the upper end of the elongated housing.

5. A method of processing a preloaded solder ball wafer chip within a single vertically oriented, elongated flux free solder reflow chamber comprising the steps of:
arranging a flux free solder ball loaded wafer chip onto a wafer chip adapter support ring;
heating an upper end of the flux free solder reflow chamber through a primary stationary top heating ceiling member arranged therewith, and a separate ring heater spaced therefrom within the reflow chamber; and
moving the wafer chip adapter support ring toward and away from the upper end of the flux free solder reflow chamber as needed, in response to a sensor controlled computer feedback loop signal from an array of wafer chip lifting elevator pins.

6. The method of processing a preloaded solder ball wafer chip within a single vertically oriented reflow chamber, as recited in claim 5, including:
sensing the temperature of the wafer chip supported on the wafer chip adapter support ring by an array of sensors in contact with and carried by the elevator pins in communication with a control computer.

7. The method of processing a preloaded solder ball wafer chip as recited in claim 6, including:
securing the wafer chip supported on the wafer chip adapter support ring against a bottom heater, by a vacuum source arranged through the bottom heater and suctioning the wafer chip thereagainst, to insure close firm heating between the wafer chip and the bottom heater.

8. The method of processing a preloaded solder ball wafer chip as recited in claim 7, including:
lifting the wafer chip adapter support ring and the wafer thereon vertically upwardly by a peripheral array of vertically displaceable elevator pins arranged outwardly of the bottom heater.

9. The method of processing a preloaded solder ball wafer chip as recited in claim 8, including:
arranging a plurality of grooves across the bottom heater so as to enable full vacuum controlled suction of the heated wafer thereagainst.

10. The method of processing a preloaded solder ball wafer chip, as recited in claim 9, including:
separating the plurality of grooves across the bottom heater into different individually controlled negatively pressurizable collections to enable different vacuum strengths to be applied thereacross for the conduction heat treatment of the wafer.

11. The method of processing a preloaded solder ball wafer chip as recited in claim 10 including:
advancing the wafer chip adapter support ring to a successive treatment cooling chamber for conductive cooling of the wafer chip on a convective cooling gas flow plate; and
applying a showerhead of nitrogen gas onto the wafer chip in an upper end in the treatment cooling chamber.

12. A vertically oriented $1^{st}$ heat treatment chamber and a vertically oriented $2^{nd}$ chip cooling treatment chamber for the processing of a flux free solder ball loaded wafer chip, comprising:
a first or upper heater at an upper end of the $1^{st}$ treatment chamber;
a second or lower heater at a lower end of the $1^{st}$ treatment chamber; and
a preloaded flux free solder ball loaded wafer chip support ring movable upwardly and downwardly within the $1^{st}$ treatment chamber for the heating of a flux free solder ball loaded wafer chip therein, in response to temperature sensed monitoring of a wafer chip supported on the wafer chip support ring, wherein the entire heating process of a flux free solder ball loaded wafer chip occurs during vertical motion of that wafer chip within the $1^{st}$ treatment chamber;
an indexable rotatable carrier disc for rotating a heat treated wafer chip on the elevator pins;
a chip receivable gas flow cooling plate arranged intermediately within the $2^{nd}$ treatment chamber arranged to receive a heated treated wafer chip, wherein the gas flow cooling plate is vertically advanceable towards a nitrogen gas dispensing showerhead for convectively cooling the heat treated wafer chip.

13. A method of heat processing a preloaded solder ball wafer chip within a single vertically oriented, elongated flux free solder reflow chamber comprising the steps of:
arranging a flux free solder ball loaded wafer chip onto a wafer chip adapter support ring;
heating an upper end of the flux free solder reflow chamber to a proper first specific upper temperature;
heating a lower end of the flux free solder reflow chamber to a proper second specific lower temperature; and
holding and moving the wafer chip adapter support ring between vertical positions in a material-required temperature gradient within the flux free solder reflow chamber, as needed, in response to an adapter support ring mounted sensor in communication with a controlled computer feedback loop signal.

14. Method of heat processing a preloaded solder ball wafer chip as recited in claim 13 including:
introducing a treatment gas at a specific temperature and pressure through a plurality of gas inlet ports in a sidewall and into the upper end of the flux free solder reflow chamber; and
exhausting the treatment gas out of the upper end of the flux free solder reflow chamber during the heat treatment process.

15. A grouping of wafer production units for service by a common robotic wafer supply and retrieval arm, comprising a revolvable array of a plurality of vertically oriented wafer treatment chambers supported on a carrousel, for the processing of a flux free solder ball loaded wafer chip, each vertically oriented treatment chamber comprising:

a first or upper heater at an upper end of the treatment chamber;

a second or lower temperature control unit arranged at a lower end of the treatment chamber; and a preloaded flux free solder ball loaded wafer chip support ring movable upwardly and downwardly within the treatment chamber in response to temperature sensed monitoring of a wafer chip supported on the wafer chip support ring, wherein the grouping of wafer production units includes an elongated vertically arranged cooling chamber arranged to intermittently receive a series of treated wafers on a rotatable carrier disc, wherein the carrier disc supports a vertically displaceable annular adapter ring carrying a treated wafer thereon, and wherein the vertically displaceable annular adapter ring carrying the wafer by a chilled gas flow plate lifted by an annular array of linkage members extends from the lower end of the treatment chamber and up into the upper end of the treatment chamber.

* * * * *